United States Patent
Sobel

(10) Patent No.: US 6,891,434 B2
(45) Date of Patent: *May 10, 2005

(54) SYSTEM AND METHOD FOR A STARTUP CIRCUIT FOR A DIFFERENTIAL CMOS AMPLIFIER

(75) Inventor: David A. Sobel, San Francisco, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/664,076

(22) Filed: Sep. 17, 2003

(65) Prior Publication Data

US 2004/0051586 A1 Mar. 18, 2004

Related U.S. Application Data

(63) Continuation of application No. 10/338,918, filed on Jan. 9, 2003, now Pat. No. 6,653,901, which is a continuation of application No. 10/208,044, filed on Jul. 31, 2002, now Pat. No. 6,570,448.
(60) Provisional application No. 60/350,035, filed on Jan. 23, 2002.

(51) Int. Cl.[7] .............................................. H03F 3/45
(52) U.S. Cl. ...................................... 330/253; 330/258
(58) Field of Search ............................... 330/253, 258, 330/259, 69; 327/359

(56) References Cited

U.S. PATENT DOCUMENTS

| 4,024,462 | A | * | 5/1977 | Highnote et al. ............ 330/259 |
|---|---|---|---|---|
| 5,283,535 | A | * | 2/1994 | Sevenhans et al. ......... 330/253 |
| 5,493,253 | A | * | 2/1996 | Ogou ......................... 330/256 |
| 6,107,882 | A | | 8/2000 | Gabara et al. |
| 6,246,289 | B1 | | 6/2001 | Pisati et al. |
| 6,480,066 | B1 | | 11/2002 | Madni |

* cited by examiner

Primary Examiner—Henry Choe
(74) Attorney, Agent, or Firm—Sterne, Kessler, Goldstein & Fox PLLC

(57) ABSTRACT

A system is provided for correcting start-up deficiencies in an amplifier. The system includes a comparing device configured to (i) receive a second circuit node voltage and a reference voltage as inputs, (ii) compare the received second circuit node voltage and the reference voltage, and (iii) produce a compensating voltage signal based upon the comparison. Next, an active device has a control terminal connected to an output port of the comparing device and is configured to receive the compensating voltage signal. The active device also includes an output terminal connected to the control terminal of the second active device, and a common terminal connected to a first circuit node. Another active device has a control terminal connected to the output port of the comparing device and is configured to receive the compensating voltage signal. The other active device also has an output terminal connected to the control terminal of the first active device, and a common terminal connected to the first circuit node.

5 Claims, 9 Drawing Sheets

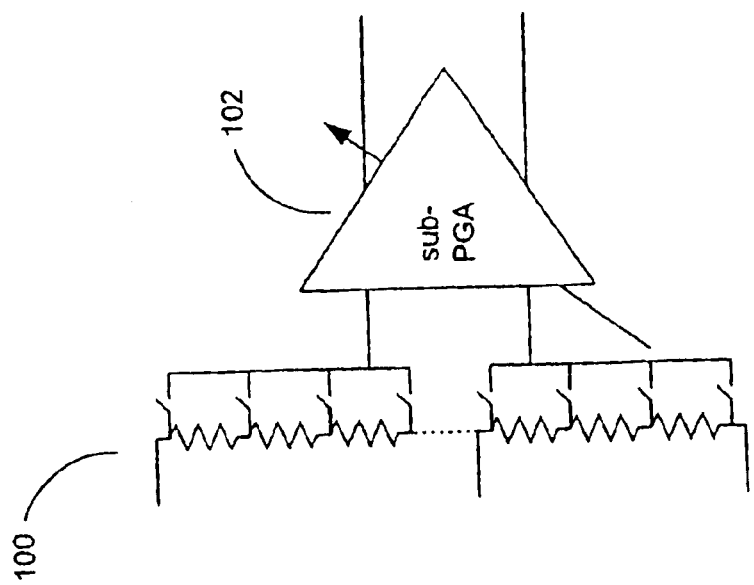
FIG. 1
(CONVENTIONAL)

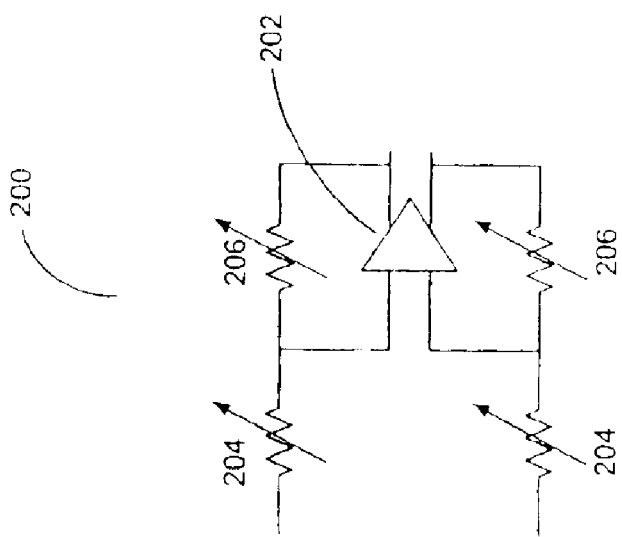
FIG. 2
(CONVENTIONAL)

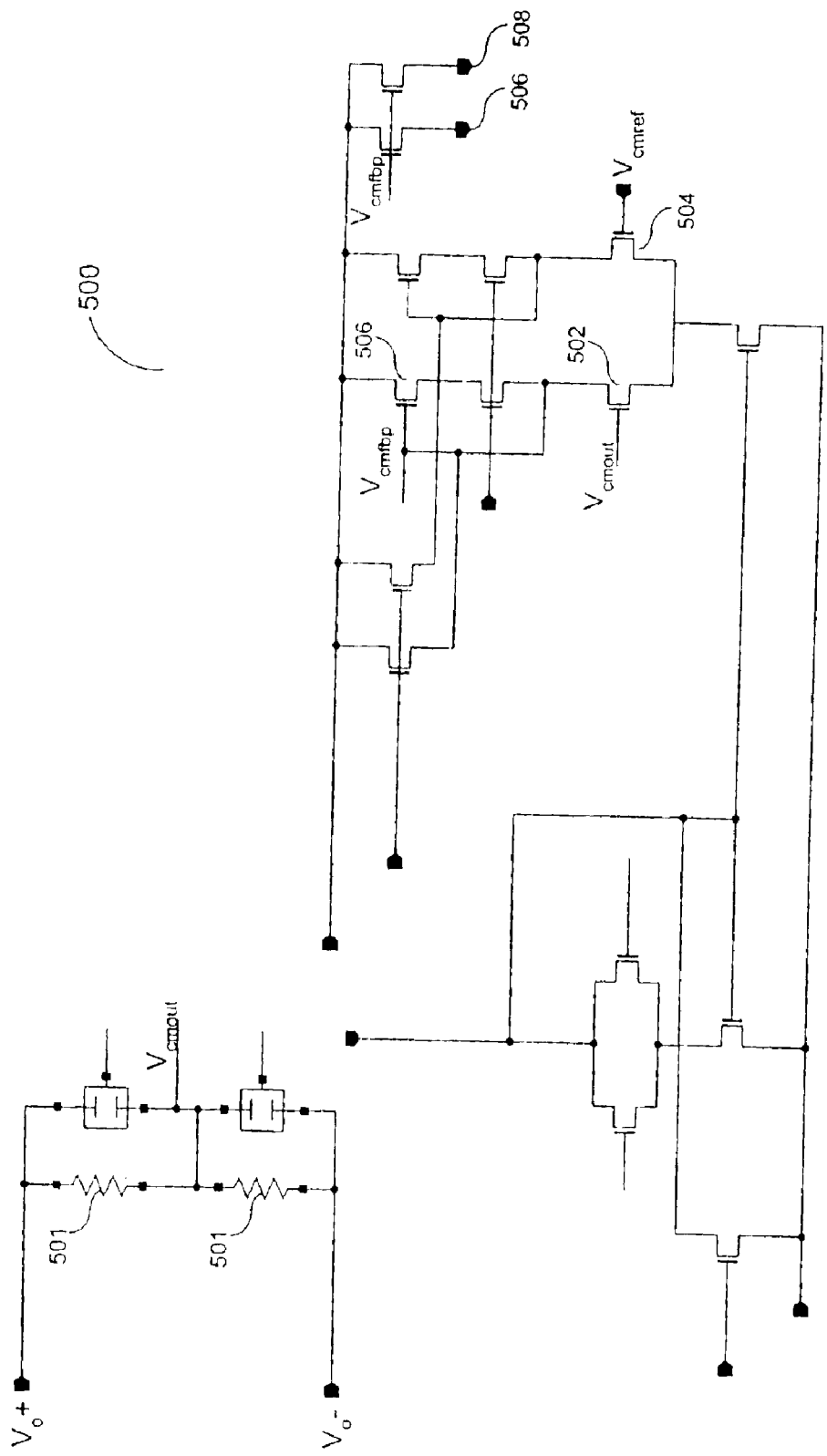
FIG. 5
(Conventional)

SYSTEM AND METHOD FOR A STARTUP CIRCUIT FOR A DIFFERENTIAL CMOS AMPLIFIER

CROSS-REFERENCE TO RELATED APPLICATIONS

This application is a continuation of U.S. Non-Provisional application Ser. No. 10/338,918, filed Jan. 9, 2003 now U.S. Pat. No. 6,653,901, which is a continuation of U.S. Non-Provisional application Ser. No. 10/208,044, filed Jul. 31, 2002 now U.S. Pat. No. 6,570,448, which claims the benefit of U.S. Provisional Application No. 60/350,035, filed Jan. 23, 2002, all of which are incorporated herein in their entireties by reference.

BACKGROUND OF THE INVENTION

1. Field of the Invention

The present invention relates generally to the field of low-noise amplifiers. In particular, the present invention relates to the development of low-noise programmable gain amplifiers (PGAs) suitable for placement on integrated circuits (ICs) and for use in signal processing applications.

2. Related Art

PGAs are used in various analog signal processing applications where an electrical signal of varying amplitude must be either amplified or attenuated before subsequent signal processing. Various gain and/or attenuation settings are required to accommodate the wide dynamic range needed for the amplifier's input stages. Numerous conventional techniques exist for meeting these demands.

What are needed, however, are techniques for providing attenuation in closed loop amplifiers without increasing their feedback factor. What is also needed is an approach to ensure suitable start-up conditions and avoid latchup, particularly in complimentary metal oxide semiconductor (CMOS) PGAs. Finally, a technique is needed to eliminate mismatched characteristics commonly found in passive elements across IC substrates due to process gradients.

SUMMARY OF THE INVENTION

The present invention includes a startup circuit including a comparing device configured to (i) receive a second circuit node voltage and a reference voltage as inputs, (ii) compare the received second circuit node voltage and the reference voltage, and (iii) produce a compensating voltage signal based upon the comparison. An active device has a control terminal connected to an output port of the comparing device and is configured to receive the compensating voltage signal. The active device also includes an output terminal connected to the control terminal of the second active device, and a common terminal connected to a first circuit node. Another active device has a control terminal connected to the output port of the comparing device and is configured to receive the compensating voltage signal. The other active device also has an output terminal connected to the control terminal of the first active device, and a common terminal connected to the first circuit node.

BRIEF DESCRIPTION OF THE FIGURES

The accompanying drawings, which are incorporated in and constitute part of the specification, illustrate embodiments of the invention and, together with the general description given above and detailed description of the embodiments given below, serve to explain the principles of the present invention.

FIG. 1 is an illustration of a conventional sub-PGA module having a high input resistance;

FIG. 2 is an illustration of a standard PGA module with active attenuation;

FIG. 5 is a schematic diagram of a conventional common mode feedback circuit which can be used to insure proper start-up conditions in the PGA of FIG. 4;

DETAILED DESCRIPTION OF THE INVENTION

Figure 3:
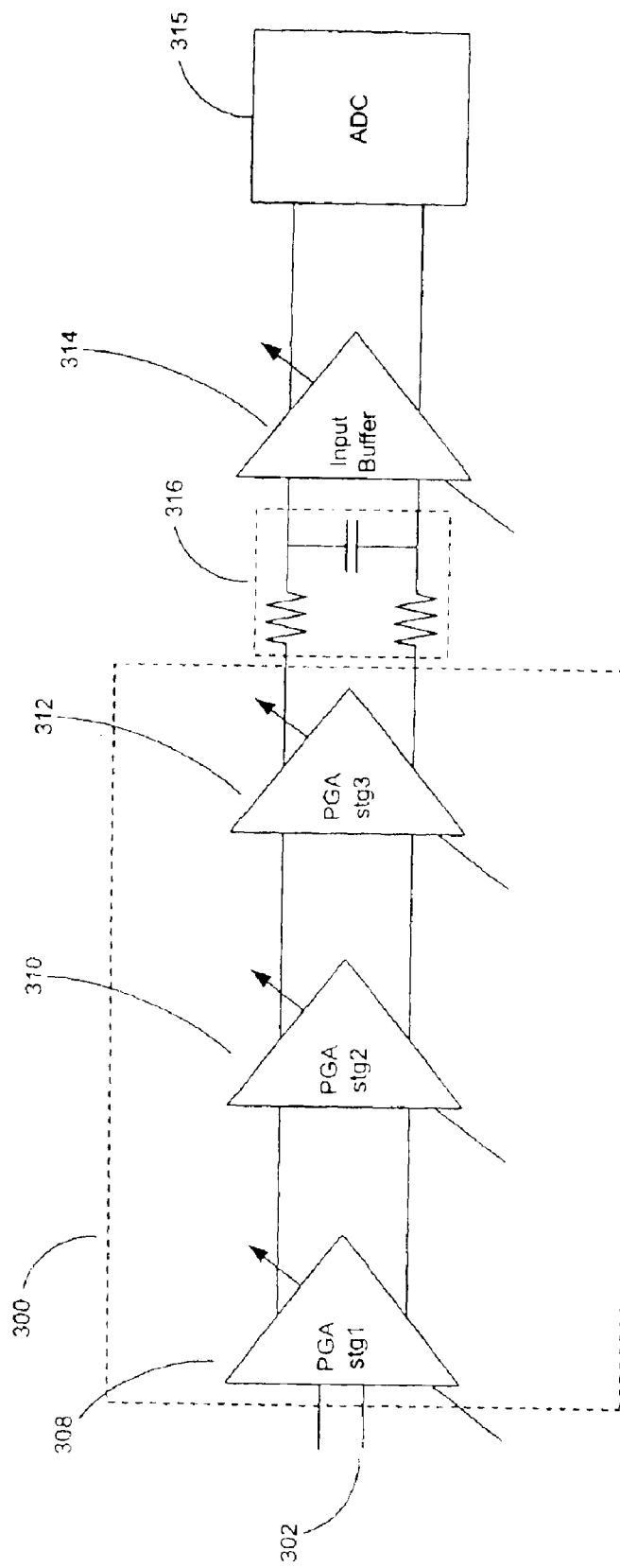
FIG. 3 is a block diagram illustration of an exemplary receive path constructed and arranged in accordance with the present invention.

The following detailed description of the accompanying drawings illustrates exemplary embodiments consistent with the present invention. Other inventions are possible, and modifications may be made to the embodiments within the spirit and scope of the invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware and/or the entities illustrated in the figures. Any actual software code with the specialized control hardware to implement the present invention, is not limiting of the present invention. Thus, the operation and behavior of the present invention will be described with the understanding that modifications and variations of the embodiments are possible, given the level of detail presented herein.

FIG. 1 is an illustration of a conventional pre-attenuator 100 followed by a sub-PGA 102 with high-input resistance. In this topology, the pre-attenuator 100 is a separate passive attenuator followed by the sub-PGA 102, which has a high input resistance. A sub-PGA is a circuit block that can provide a variable gain, but does not necessarily provide attenuation. The sub-PGA 102 can consist of one or more circuit blocks. In particular, the sub-PGA 102 may contain a buffer followed by a more traditional PGA module.

The key characteristic of the sub-PGA 102 is that it typically has high input resistance. Because of the high input resistance of the sub-PGA 102, the pre-attenuator 100 and sub-PGA 102 do not interact, thus reducing the possibility of a beneficial reduction in the sub-PGA 102's feedback factor. The feedback factor is a numerical index that is related to the ratio of the resistors in closed loop amplifiers that have resistive feedback networks. The ratio of the resistors changes the feedback factor which in-turn changes the amplifier's gain. When amplifier's are used to provide attenuation, the feedback factor typically increases, which consequently makes the amplifier's performance unstable. Therefore, the relationship between gain and the amplifier's feedback factor becomes problematic when the amplifier is used as an attenuator.

One alternative approach for providing attenuation in amplifiers is to have a passive or an active programmable attenuator followed by a separate, programmable gain amplifier. If the programmable attenuator and the PGA are separate, however, a feedback factor reduction will be difficult to achieve. Another alternative approach is to use the programmable gain amplifier as an active attenuator. However, using the programmable gain amplifier as an active attenuator creates two significant problems. First, the issue of the feedback factor becomes a more significant consideration, and the associated substrate area required to accommodate the amplifier and the attenuator become extremely large.

Next, a standard PGA circuit 200 with active attenuation is shown in FIG. 2. In the topology of the PGA circuit 200, there is a standard inverting-gain PGA 202 where attenuation is achieved in the feedback network by making an input resistance 204 larger than a feedback resistance 206.

When using CMOS devices, there is a need to guarantee that the PGA circuits such as the PGA circuit 200, start up and achieve desirable operating points under a wide variety of start-up, bias, and environmental conditions. In 2-stage differential amplifiers that are typically associated with CMOS circuits, the common-mode (CM) signal loop of the first stage amplifier has net positive feedback. Therefore, it is possible that this positive feedback may cause the amplifier to reside in an unwanted latch-up state, especially if the amplifier's positive CM feedback characteristics are able to overpower the negative CM feedback characteristics of the second stage amplifier, also known as the CM feedback amplifier (CMFBA).

Conventional approaches for eliminating the start-up problem include making the CMFBA large enough so that the primary amp CM loop (positive feedback) can never overpower the CMFBA loop (negative feedback). This approach might be considered a high-power, high-noise solution.

Another conventional approach for resolving the start-up problem includes providing a high impedance value pull-up resistor to force voltage on a common source (CM-src) node. For an amplifier configured in this manner, a high-valued resistor connected from a supply voltage source VDD to the CM-src node can pull up the CM-src node in order to force proper start-up. This approach, however, requires extra power and adds noise to the associated system.

Another challenge to the development of PGAs suitable for placement on ICs is that the ICs often require passive elements, such as resistors, that are well-matched to one another. Silicon processing, for example, is an imperfect process that frequently results in process gradients, where the characteristics of a particular device will vary roughly linearly across a certain dimension of the IC's substrate. This linear gradient can cause severe mismatch between devices, such as resistors, that need to be well-matched to one another.

In order to achieve a sufficient gain range and gain resolution (i.e., gain step size), complex resistive feedback networks are typically used within the amplification modules. This comes at the cost of increased associated die sizes. Additionally, since closed-loop gain and feedback factor are inversely related, in order to achieve a large gain range, it often requires the feedback factor to span a wide range. This complicates the design of the amplifier, which must be guaranteed to be stable and functional over the wide feedback factor span. All these problems must be solved while keeping the closed-loop performance of the PGA sufficiently linear.

One aspect of the present invention merges a passive pre-attenuator network with the feedback network used within the amplifier. PGA functionality is achieved by using a closed-loop amplifier with a switchable resistor network in the feedback loop to provide passive attenuation. This accomplishes three goals. Since the pre-attenuator can be controlled separately from the rest of the feedback network, it allows for greater controllability of the net PGA gain. Therefore, the total complexity of the feedback network can be reduced.

Next, the nature of the pre-attenuator of the instant invention is such that when it's used to reduce the overall PGA gain, the overall feedback factor is reduced as well. By contrast, if a conventional feedback network is used to reduce the overall PGA gain, the overall feedback factor increases. Therefore, using the present invention and with careful partitioning of the overall gain between the pre-attenuator and the remainder of the feedback network, one can achieve a wide gain range with a much smaller variation in the feedback factor. This aspect eases the circuit design of the amplifier.

Finally, the first stage feedback network is configured to have CMOS switches placed on a virtual ground. Therefore, no signal current flows through these switches when CMOS technology is used. Also, the switches in the attenautor network have a symmetric differential drive applied to them. Therefore, the linearity of the network will be sufficiently high.

FIG. 3 provides an illustration of an exemplary PGA 300, its analog front end, and associated digital circuitry. The general purpose of the PGA 300 is to provide gain (amplify) an input signal having a small amplitude so that downstream analog-to-digital converters (ADCs) can receive it and sample a signal having a sufficiently large amplitude. Therefore, the PGA is the first block positioned along a receive path 302 of the PGA 300. Although any number of PGA stages can be accommodated, for purposes of illustration, the PGA 300 includes three amplification stages 308, 310, and 312.

The PGA 300 of FIG. 3 can also include an input buffer 314 for driving a switched capacitor circuit (not shown) inside an ADC 315. Next, a low pass filter 316 is included for removing unwanted energy at out-of-band frequencies. The input buffer 314 is a fourth amplifier separate and apart from the three amplification stages 308, 310, and 312 of the PGA 300. A first aspect of the PGA 300 is associated with switching inside of the PGA, pre-attenuation characteristics, and providing a lower feedback factor.

Figure 4:
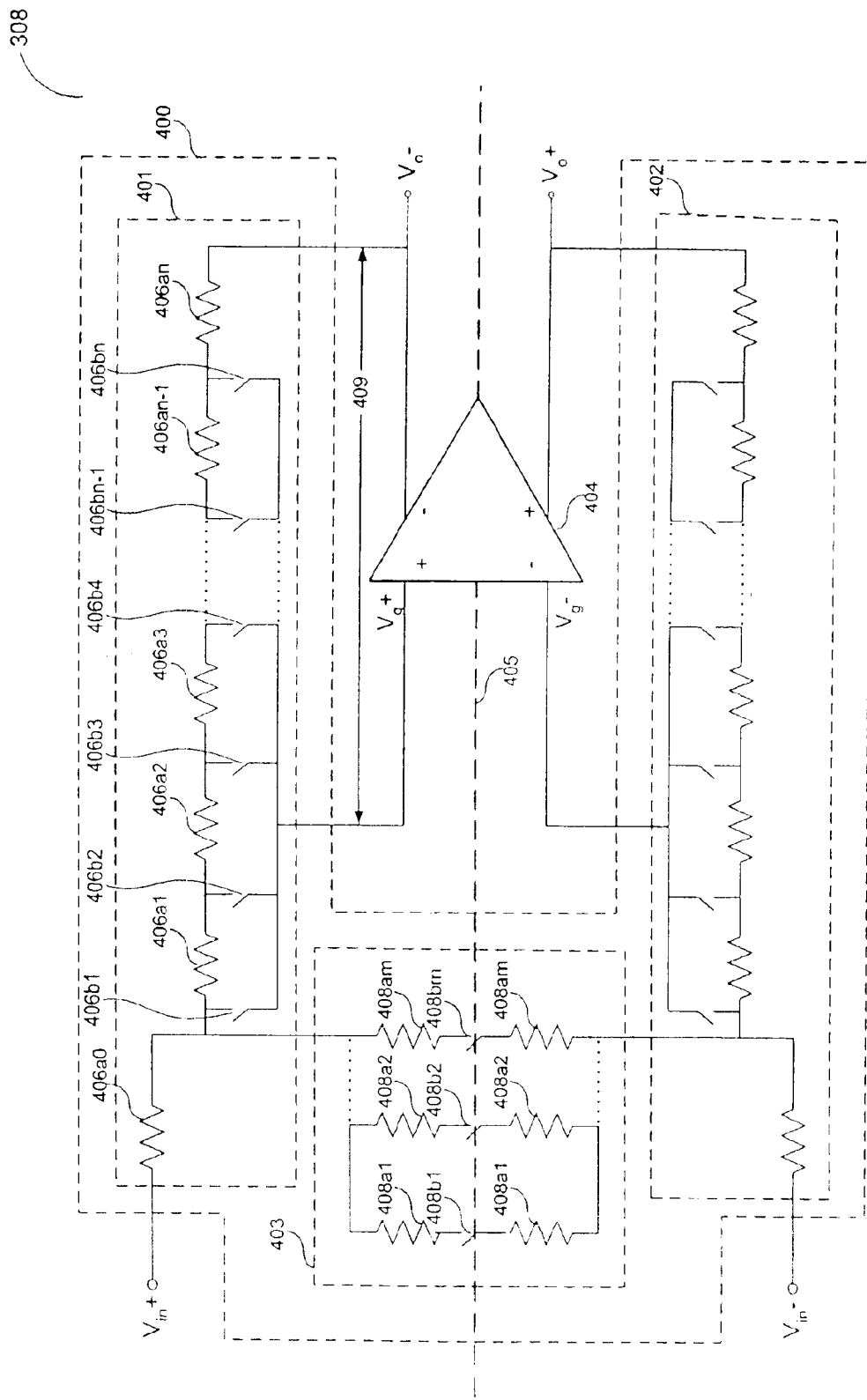
FIG. 4 is a more detailed block diagram illustration of a first stage PGA shown in FIG. 3 constructed and arranged in accordance with the present invention.

FIG. 4 is a more detailed illustration of the first amplification stage 308 of the PGA 300 shown in FIG. 3. Particularly, FIG. 4 shows a resistive feedback network 400 including network segments 401–403 (discussed in greater detail below) connected with an amplifier 404. In the exemplary embodiment of FIG. 4, the amplifier 404 is a differential amplifier including differential input and output ports. The network segments 401 and 402 are structurally identical. Since the segments 401 and 402 are attached to respective symmetrical differential portions of the amplifier 404, they are also functionally identical.

A dotted line 405 indicates an axis of symmetry regarding the layout of the amplifier 404. Therefore, comments directed to the network segment 401 will also apply to the network segment 402. Additionally, the network segment 403 is functionally structured along the amplifier's symmetrical axis 405. The voltage applied to the network segments 401–403 is also symmetric and differential. This symmetric differential swing prevents any non-linearities that might be associated with the CMOS process from being excited. Therefore, the linearity of the amplifier 404 and the resistive network 400 will be sufficiently high.

Another important function of the PGA 300 is to provide an amplifier having a settable or programmable gain. Programmability can be achieved by altering the input and output impedances of the feedback network 400. Gain, for example, is a function of the ratio of resistor impedances within the network segments 401–403. The network segments 401–403 shown in FIG. 4 are connected between non-inverting amplifier input port Vg+ and inverting output port Vo− and between inverting input port Vg− and non-inverting output port Vo+ of the amplifier 404. In the process of changing the impedance of the resistors within the network segments 401–403, the feedback factor and the gain of the amplifier 404, correspondingly change.

Changing the feedback factor has a number of effects concerning issues such as the linearity of an amplifier, the noise of the amplifier, and the amplifier's stability. The higher the feedback factor, the better the performance of the amplifier in terms of noise and linearity. However, the amplifier may lose a measure of stability if the feedback factor is permitted to get too high. In other words, it's more difficult to maintain the stability of the amplifier if its feedback factor is too high.

As noted above, the feedback factor is a numerical index derived based upon the topology of the amplifier and the feedback network. It is related to the ratio of the resistor values within the amplifier's associated resistive feedback network. For example, given an amplifier with a resistive feedback network, a user can directly calculate the feedback factor, which will typically be a number between zero and one. The feedback factor is also known as the beta-factor of a closed loop amplifier and is more of a quantitative, as opposed to a qualitative, measure of the amplifier's performance. Therefore, changing the ratio of the resistor impedance values changes the feedback factor, which in-turn changes the gain of the amplifier.

In traditional approaches, there is a one-to-one correspondence between the desired gain and the feedback factor present in the amplifier. They are essentially inversely related. The terms are not directly inversely related because the associated mathematical expressions depict a more complicated relationship.

If one desires a low gain or equivalently, desires attenuation, the feedback factor of conventional amplifiers increases and asymptotically approaches the value one, making it harder for the amplifier to become stable. On the other hand, if one desires a higher gain, the feedback factor reduces and asymptotically approaches the value of zero, and it becomes easier to make the amplifier stable. Conventional first stage amplifiers have a wide spread in terms of gain. For example, ranges of about −12 dB to +12 dB are not uncommon and are representative of voltage gains of about 0.25 to 4. Thus, the feedback factor can vary by a substantial amount in these conventional amplifiers.

In the present invention, however, the resistive network segment 403 is configured to cooperate with the resistive network segments 401 and 402 to facilitate small gains in the amplifier 404 without increasing its feedback factor. More specifically, the network segments 401 and 402 facilitate traditional gain increases within the amplifier 404. For example, resistors 406a0, 406a1–406an, and switches 406b1–406bn of the network segment 401, cooperatively function to provide the amplifier 404 with gain values greater than or equal to one. The resistor 406a0 is a first portion of the network segment 401, while the resistors 406a1–406an and switches 406b1–406bn collectively represent a second portion of the network segment 401.

The exemplary network segment 403, on the other hand, facilitates gain values of less than one. In particular, the network segment 403 enables the amplifier 404 to attenuate an input signal received at an input port Vin+ of the amplification stage 308 without increasing the amplifier's feedback factor. When attenuation is desired, switches 408b1–408bm can be closed. The switches 408b1–408bm provide attenuation for the amplifier 404 and simultaneously lower the feedback factor, consequently improving the amplifier's stability. In other words, the switches 408b1–408bm form a pre-attenuator that enable the amplifier 404 to produce gain values of less than one while also lowering its feedback factor.

Conversely, the approach of the present exemplary embodiment of FIG. 4 makes it easier to design amplifiers without concern for stability related issues. The presence of resistors 408a1–408am both attenuates the input signal and lowers the amplifier's feedback factor. As noted above, conventional closed loop amplifiers are configured such that the amplifier's attenuation ability and its feedback factor typically operate in opposite directions. In these conventional amplifiers, for example, when an input signal is attenuated, the amplifier's feedback factor typically increases.

In the present invention, however, the presence of the switches 408b1–408bm and the corresponding resistors 408a1–408am allow for gain setting whereby these resistors both attenuate the signal and simultaneously lower the feedback factor. This effect is due to the mathematical relationships between the PGA gain and the resistor values in the feedback network. The gain and the feedback factor can be directly calculated based upon equations (1) and (2), assuming that the net resistances of each branch of the feedback network are as illustrated in FIG. 4A.

$$\text{Gain} = \frac{R4}{[(R1*R2)/R3] + R1 + R2} \quad (1)$$

$$\text{Feedback Factor} = \frac{R2 + [(R1*R3)/(R1+R3)]}{R4 + R2 + [(R1*R3)/(R1+R3)]} \quad (2)$$

Figure 4A:
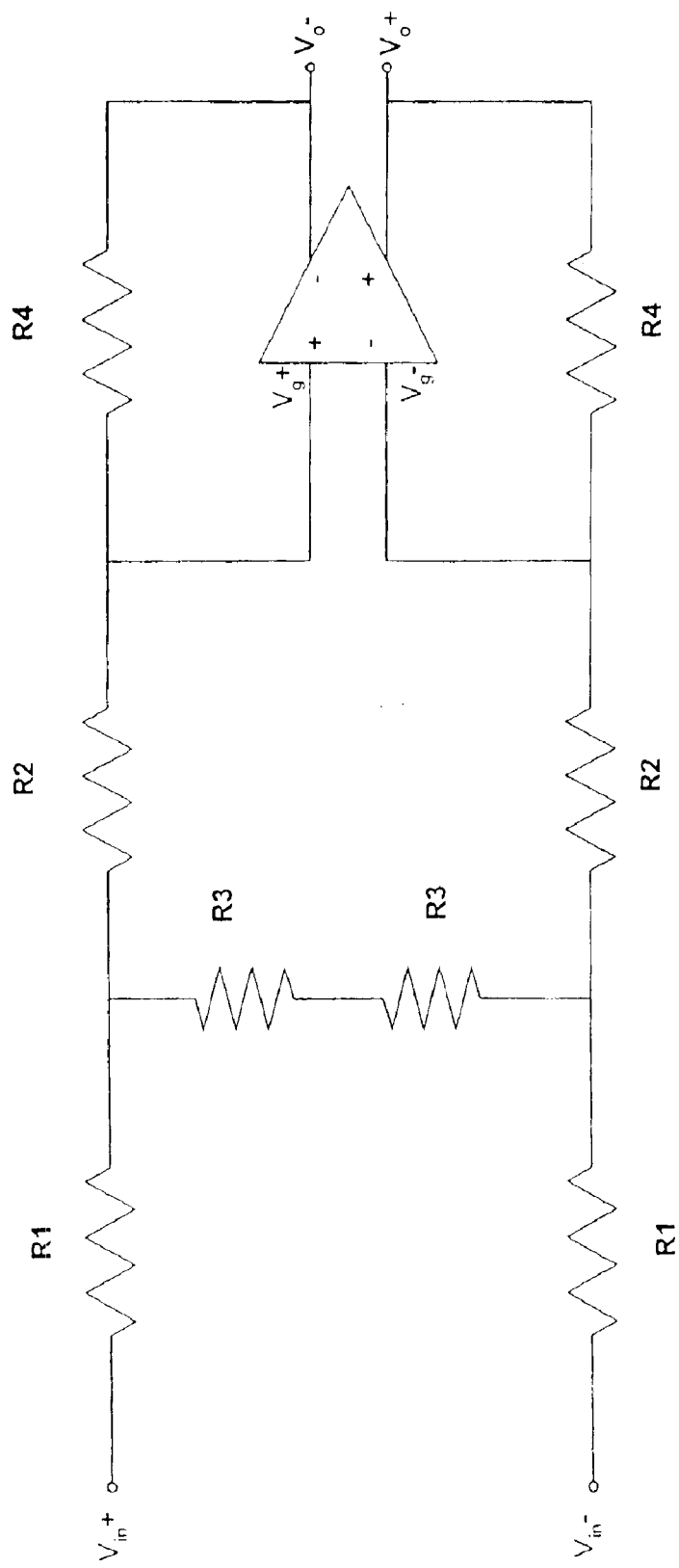
FIG. 4A is a block diagram illustration used to depict the relationship between impedance, gain, and feedback factor within the first stage PGA of FIG. 4.

In FIG. 4A, it is apparent that the values of R1, R2, and R4 are controlled based upon which switch of the set 406b1–406bn is closed. Also, it is apparent that the value of R3 is controlled by which switch(es) of the set 408b1–408bm is/are closed. In general, as more of the switches of the set 408b1–408bm are closed, the value of the R3 in FIG. 4A will go down. Examining the equations (1) and (2), one can directly calculate that reducing the value of R3 simultaneously lowers the gain and the feedback factor. Therefore, it can equivalently be stated that: by closing one or more of the set 408b1–408bm, both the gain and the feedback factor are reduced.

The switches 406b1–406bn permit the amplifier 404 to achieve a wide variety of gain settings. At any given time, exactly one switch of the set 406b1–406bn will be closed. All other switches in this set will be opened. By closing a different switch of this set 406b1–406bn, the overall gain of the PGA 308 will be impacted. In general, the closer the switch is to the input nodes (Vin+ and Vin−), the higher the resultant gain of the PGA will be when that switch is closed. For example, if switch 406b1 were to be closed, that would result in a higher PGA gain that if switch 406b4 were to be closed.

Similarly, selectively closing and opening the switches 408b1–408bm facilitates the achievement of gain values of less than 1 while also lowering the feedback factor. The presence of the resistors 408a1–408am facilitates both attenuation of the input signal and lowering of the feedback factor. The resistors 408a1–408am on the opposite sides of the respective switches 408b1–408bm are mirror images of each other.

Also, in the present invention, passive attenuation characteristics are inherently part of the structure of the amplifier 404 and the resistive network segments 401–403 that form the amplifier's feedback network 400. Thus, the amplifier 404 and the network segments 401–403 are completely integrated in terms of their structure and function. That is, the impedances associated, for example, with the switches 408b1–408bm are electrically coupled to a feedback path 409 of the amplifier 404. The result of this coupling is that an attenuation matrix formed within the feedback network 400 cannot be analyzed separately from the gain aspect of the amplifier 404. More precisely, the network segment 403 is built into the structure of the amplifier 404 and is inherently part of the feedback network 400.

FIG. 5 is an illustration of a conventional common mode feedback circuit 500 used to insure proper start-up conditions. As previously noted, particularly in CMOS circuits, there is a need to guarantee that the PGA circuit starts up and achieves a desirable operating point under number of environmental conditions. The conventional circuit 500 is configured to accommodate most common-mode excursions and fluctuations found under normal operating conditions. In essence, the circuit 500 essentially operates as a common-mode feedback circuit correcting typical start-up deficiencies that might impact an amplifier's performance. These typical start up deficiencies, however, are not severe enough to render the amplifier inoperable.

In the circuit 500, a differential output signal provided at the output terminals Vo− and Vo+ of the amplifier 404 in FIG. 4 is received at the input terminals Vo− and Vo+ of the circuit 500. A resistor string 501, connecting the input terminals Vo− and Vo+, averages the two voltages as Vcmout so that it becomes the common-mode output of the amplifier. Vcmout is then compared with an internally generated reference voltage Vcmref within differential pair transistors 502 and 504. If Vcmout is higher than Vcmref, then the differential transistor pair 502/504 is tilted so that more current flows through transistor 502 than transistor 504. This pulls a common-mode feedback voltage Vcmfbp at a common-mode feedback transistor 506, low.

Thus, if the common-mode output is too high, the circuit 500 pull the common-mode feedback voltage Vcmfbp low. When Vcmfbp is pulled low, then Vo− and Vo+ are also pulled low via a correcting signal provided at common-mode outputs 506 and 508, which is in-turn provided as an input to the amplifier 404. The circuit 500 is therefore effective at correcting minor start-up deficiencies in the amplifier 404 such as fluctuations in the common-mode voltage Vcmfbp. The circuit 500, however, has a somewhat limited range and capability. That is, although its effective against, for example, minor common-mode fluctuations, it is not effective at eliminating more severe start-up deficiencies such as common-mode latch-up, which can render the amplifier 404 completely inoperable.

Figure 6:
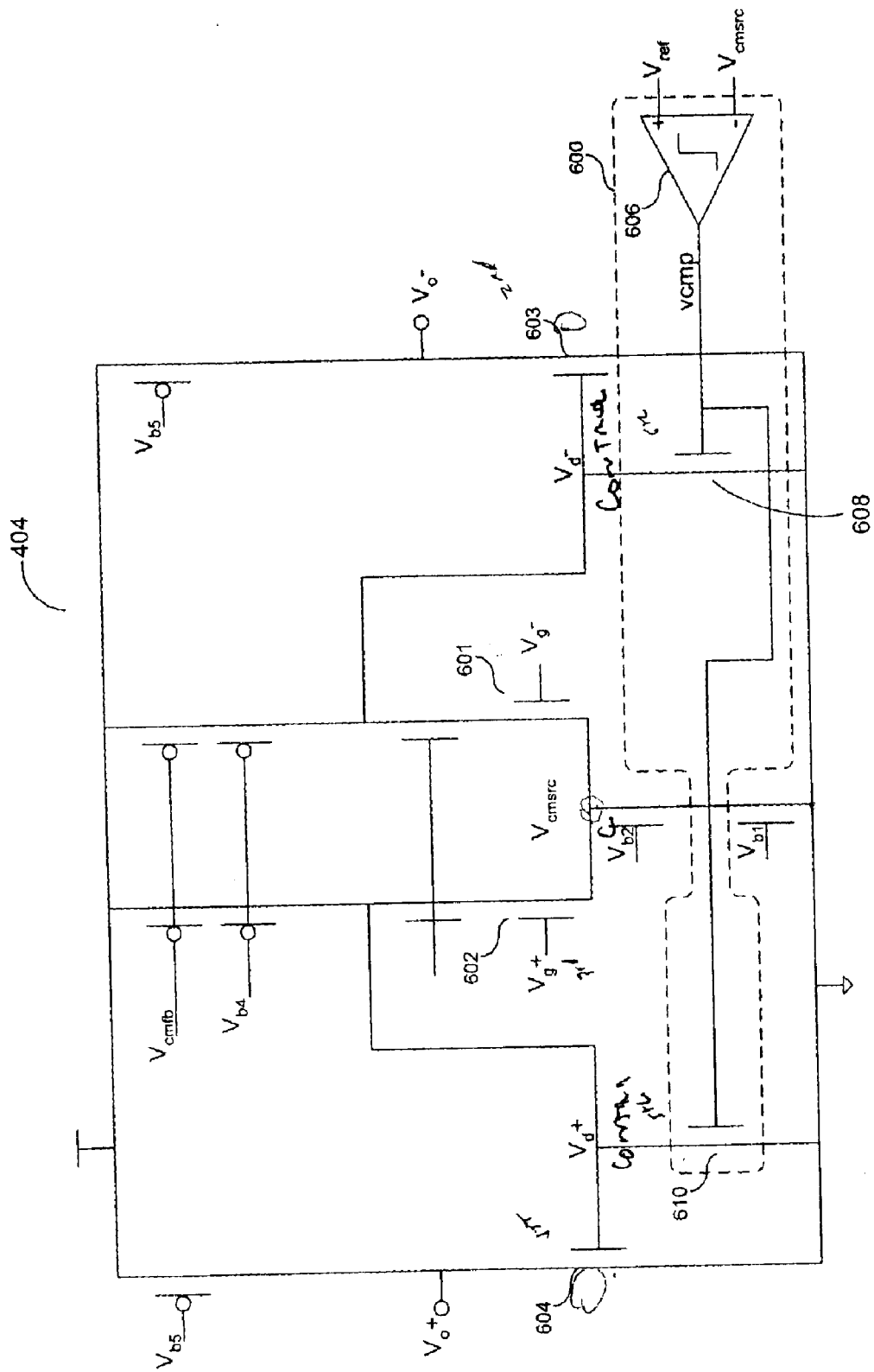
FIG. 6 is a block diagram of the amplifier in the PGA of FIG. 4, including an exemplary start-up circuit constructed and arranged in accordance with the present invention.

FIG. 6 provides a more detailed illustration of the amplifier 404 shown in FIG. 4, including an exemplary start-up circuit 600 configured to eliminate the more severe start-up deficiencies such as common-mode latch-up, which can render the amplifier 404 inoperable.

In the illustrations of FIGS. 4 and 6, the input CM, the output CM, and the CM of the gate of the amplifier 404 are significant structural factors. That is, the input to the resistor network, the input to the amplifier, and the output to the amplifier are all dependent upon one another. There are no additional DC paths connected to the input of the PGA 308 (nodes Vin+and Vin− of FIG. 4). Therefore, from the DC standpoint, the input to the PGA 308 is floated.

From a start-up perspective, the amplifier, when the input voltage ramps up, could start up in a state where, if the output-common mode is low, for example near ground, then the input to the amplifier will also be pulled down to ground. That is, the input to the amplifier will be substantially the same voltage as the output to the amplifier. Therefore, on start-up, it cannot be certain as to which voltage the amplifier will assume when it is initially powered up, since this cannot be easily controlled. Therefore, if the output-common mode happens to be very low, the input-common mode will also be very low, and that will shut off the amplifier.

In the illustrative embodiment of FIG. 6, the exemplary start-up circuit 600 senses whether the aforementioned or a similar start-up problem has manifested itself, and then forces the output node of the amplifier 404 to rail. That is, the start-up circuit 600 essentially rails it to $V_{DD}$, therefore bringing the amplifier out of the bad start-up condition, then turns the start-up circuit 600 off. After operation of the start-up circuit 600, the amplifier 404 will then assume a more suitable state of operation. The nature of the amplifier 404 is such that if the output-common mode is too high, that is operating near $V_{DD}$ rail, then the amplifier 404 is still functional, and is devoid of voltage-related start-up problems. On the other hand, if the output-common mode of the amplifier 404 is too low, the amplifier 404 will not start up.

0056 In the illustration of FIG. 6, the differential input ports Vg+ and Vg−, the differential output ports Vo+ and Vo−, and voltage sources Vb1–Vb5 of the amplifier 404 are shown. Source terminals of input differential active devices 601 and 602 form a common-source node (cmsrc). Also included in the embodiment of FIG. 6 is the exemplary start-up circuit 600 and active devices 603–604.

The start up circuit 600 includes a comparing device, such as a comparator 606 and active devices 608 and 610. In the embodiment of FIG. 6, the active devices 601–604, 608, and 610 are field effect transistors (FETs), although other active device types can be used. Common-mode latch-up, for example, can pull the differential output terminal Vo+ and Vo− to ground. To counteract this effect, the comparator 606 monitors a voltage Vcmsrc at the cmsrc node to determine if this voltage goes below a predetermined amount. If Vcmsrc falls below the predetermined amount, the comparator 606 produces an output compensatory voltage Vcmp to a positive supply level to pull up the level of Vo+ and Vo−. This ultimately pulls Vcmsrc back up, as explained in greater detail below.

In monitoring Vcmsrc, the comparator 606 determines whether Vref is greater than Vcmsrc. If Vref is greater, the comparator 606 outputs the compensatory voltage Vcmp at positive supply. That is, if the positive terminal of the comparator 606 is larger than its negative terminal, a positive supply voltage is produced as an output. This compensatory output voltage Vcmp then turns on the devices 608 and 610.

When the devices 608 and 610 are activated by the compensatory voltage Vcmp, they in-turn pull voltages Vd+ and Vd−, shown in FIG. 6, basically to ground. Vd+ and Vd− being pulled to ground temporarily turn off the devices 603 and 604. This allows Vo+ and Vo− to be pulled back up. Once Vo+ and Vo− are pulled back up, Vg+ and Vg− are pulled up as well through the resistive feedback network 400, shown in FIG. 4. Once Vg+ and Vg− are pulled up, the active devices 601 and 602 begin conducting current, enabling the amplifier 404 to reach a stable start-up state. Furthermore, once Vg+ and Vg− are pulled up, Vcmsrc is also pulled up. When Vcmsrc exceeds Vref, the compensatory output voltage Vcmp gets pulled to ground so that the devices 608 and 610 are turned off. Consequently, the amplifier 404 returns to a normal operation mode.

Figure 7:
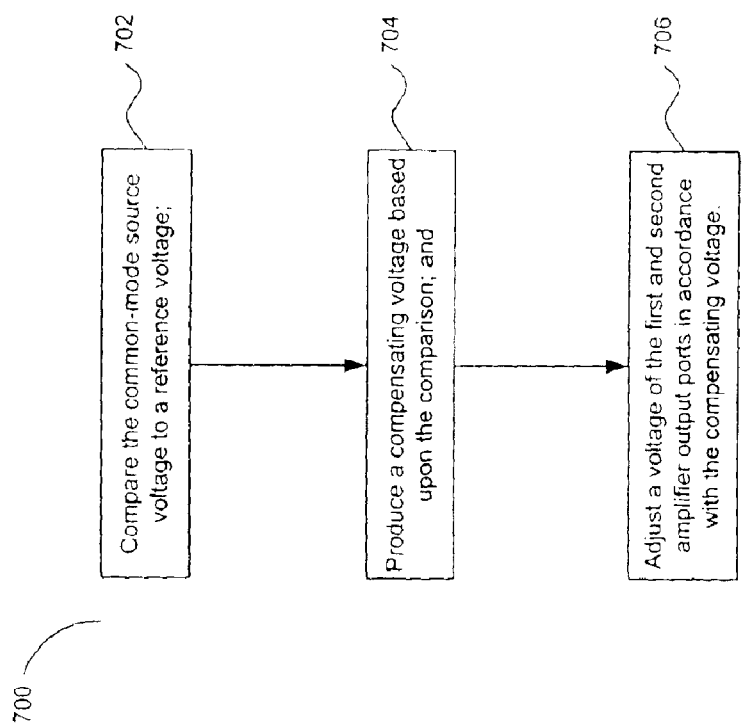
FIG. 7 is a flow chart of a method of using the start-up circuit of FIG. 6.

FIG. 7 is an illustration of an exemplary method 700 of practicing the present invention. In FIG. 7, a comparing device in a system functionally analogous to the system of FIG. 6 will compare the common-mode source voltage Vcmsrc to the reference voltage Vref in block 702. As a result of the comparison, a compensating voltage Vcmp is produced as an output to the comparing device, as depicted in block 704. Finally, the voltages Vo+ and Vo− are adjusted in accordance with the compensating voltage Vcmp, as depicted in a block 706, and the amplifier then returns to the normal operating state.

Figure 8A:
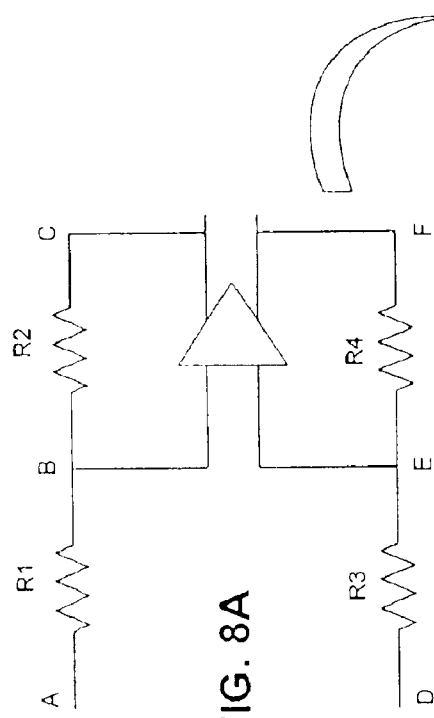
FIG. 8A is an illustration of a first step of a resistor layout constructed and arranged in accordance with the present invention.
Figure 8B:
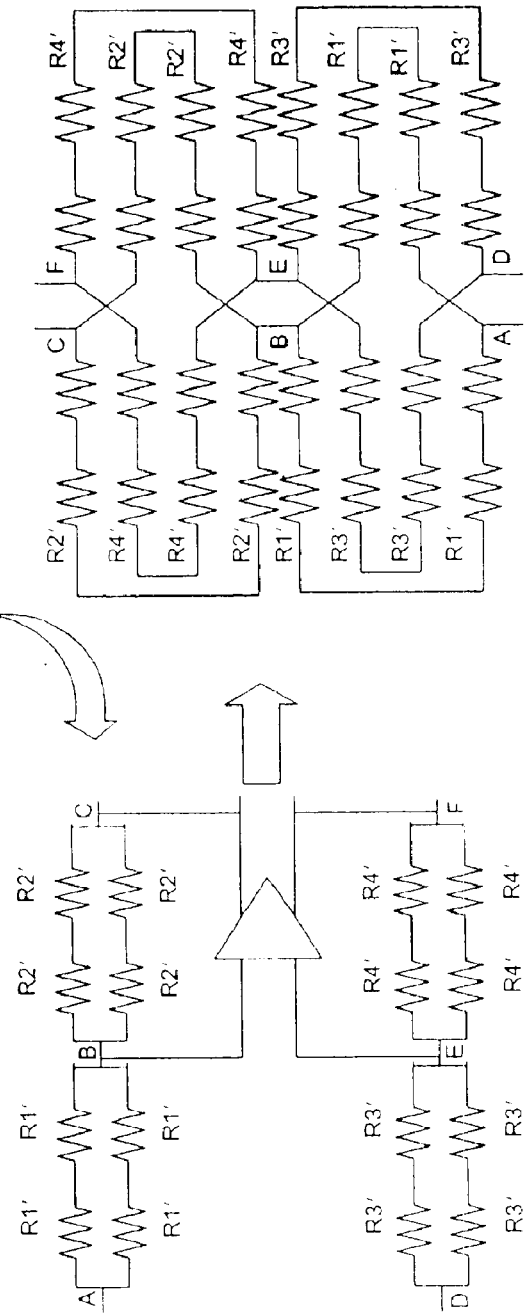
FIG. 8B is an illustration of a second step of the resistor layout of FIG. 8A.
Figure 8C:
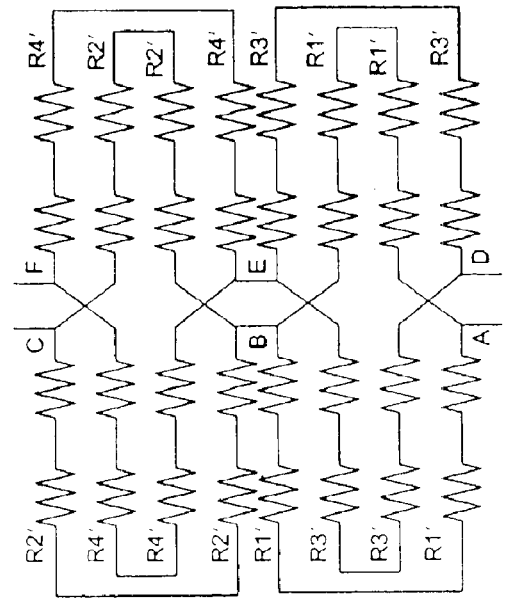
FIG. 8C is an illustration of a third step of the resistor layouts of FIGS. 8A and 8B.

FIGS. 8A–8C are an illustration of a resistor layout constructed and arranged in accordance with another aspect of the present invention. More specifically, FIGS. 8A–8C depict a technique for geometrically positioning resistors R1–R4 around the PGA to insure matching impedances across the associated IC. The layout technique can be used, for example, in construction of the resistive network 400 discussed above and can be implemented using standard IC chip fabrication processes, materiel, and equipment.

The problem addressed by the resistor layout is that due to IC manufacturing process variations, a mis-match between components, for example resistors or resistances across the IC, may result. In IC manufacturing, it is desirable that resistors of equal impedance match substantially well across the entire substrate of the IC.

In the FIG. 8A, each of the resistors R1–R4 is representative of a single resistor value. First, the value of each of the resistors R1–R4 is split to form a number of corresponding respective resistor values R1'–R4' as shown in FIG. 8B. By then configuring the resistors as shown in FIG. 8C (i.e., forming an interdigital structure across the substrate), substantially equal impedance values can be achieved throughout all the resistors. That is, the geometric pattern established by the resistors R1'–R4' connected along points A, B and C, and along points D, E and F, of FIG. 8C provide a means of achieving substantially equal impedance values throughout all of the resistors.

The arrangement shown in FIGS. 8A–8C is a type of a common centroid layout, including a technique of splitting resistance values among multiple resistors having intertwining paths. Although two series resistors are illustrated in FIG. 8B, in practice the number of resistors can be extended to any suitable number needed to meet performance requirements. Additionally, the arrangement illustrated in the embodiment of FIG. 8B can also be extended to more parallel paths snaking through the substrate and then recombining in an appropriate fashion as indicated in FIG. 8C.

In FIG. 8C, as noted, the resistors R1' between points A and B form two parallel paths. That is, a single path begins at point A, diverges, then recombines at point B. A feature of the present embodiment is that N number of parallel paths can be split to cover different areas of a substrate so that when they recombine, the device variation over the geometry of the substrate cancels itself out. Therefore, the net result of the technique of FIGS. 8A–8B is an interdigital device with averaged impedances as opposed to a skewed device.

The foregoing description of the preferred embodiments provide an illustration and description, but is not intended to be exhaustive or to limit the invention to the precise form disclosed. Modifications and variations are possible consistent with the above teachings or may be acquired from practice of the invention. Thus, it is noted that the scope of the invention is defined by the claims and their equivalents.

What is claimed is:

1. An apparatus for correcting start-up deficiencies in an amplifier including (i) a first portion having output stage transistors forming differential output ports and (ii) a second portion having input stage transistors, a common source voltage being representative of a voltage across sources of the input stage transistors, the apparatus comprising:

means for comparing the common source voltage to a predetermined reference voltage;

means for producing a compensating voltage based upon the comparison; and means for adjusting a voltage associated with the differential output ports in accordance with the compensating voltage.

2. An apparatus for correcting start-up deficiencies in a differential amplifier including a startup mechanism, the amplifier including (i) a first circuit node formed of a junction of sources of output stage transistors, gates of the output stage transistors forming differential output ports and (ii) a second circuit node formed of a junction of sources of input stage transistors, a second circuit node voltage being representative of a voltage level of the second circuit node;

the startup mechanism including:

a comparator having inverting and non-inverting input ports and an output port; and first and second transistors having (i) gates connected to the comparator output port, (ii) drains respectively connected to the gates of the output stage transistors, and (iii) sources connected to the first circuit node;

the apparatus comprising:

means for comparing the second circuit node voltage to a reference voltage;

means for producing a compensating voltage based upon the comparison; and means for adjusting a voltage associated with the differential output ports in accordance with the compensating voltage.

3. The apparatus of claim 2, wherein the comparing means is configured to receive the reference voltage at the non-inverting input port and receive the second circuit node voltage at the inverting input port.

4. The apparatus of claim 2, wherein the compensating voltage is produced when the second circuit node voltage is less than the reference voltage.

5. The apparatus of claim 2, wherein the means for adjusting is configured to (i) receive the compensating voltage in the first and second transistors, (ii) activate the first and second transistors based upon the received compensating voltage, and (iii) deactivate the first and second transistors when the second circuit node voltage becomes greater than the reference voltage.

* * * * *